United States Patent [19]

Umemura et al.

[11] Patent Number: 5,729,892
[45] Date of Patent: Mar. 24, 1998

[54] COMPONENT FEEDING SYSTEM

[75] Inventors: Shiniti Umemura, Anjo; Isao Nagata, Tokai; Tomoaki Huzii, Aichi-ken; Takumi Arai, Nagoya, all of Japan

[73] Assignee: Nippondenso Co., Ltd., Kariya, Japan

[21] Appl. No.: 608,301

[22] Filed: Feb. 28, 1996

[30] Foreign Application Priority Data

Feb. 28, 1995 [JP] Japan ................... 7-039833

[51] Int. Cl.$^6$ ................... H05K 3/30; H05K 13/02; H05K 13/04
[52] U.S. Cl. ................... 29/739; 29/33 P; 29/740; 29/741; 29/742; 29/759; 29/786; 29/793; 198/341; 198/346.1; 198/349; 414/156; 414/273
[58] Field of Search ................... 29/739–742, 784, 29/786, 787, 793–795, 33 P; 195/341, 345.3, 346.1, 349, 355; 364/468.28; 414/156, 273, 274

[56] References Cited

U.S. PATENT DOCUMENTS

| | | | |
|---|---|---|---|
| 4,719,694 | 1/1988 | Herberich et al. | 29/742 X |
| 5,191,702 | 3/1993 | Goederke et al. | 29/742 |
| 5,197,172 | 3/1993 | Takagi et al. | 29/33 P |
| 5,271,490 | 12/1993 | Stciht | 29/784 X |
| 5,452,509 | 9/1995 | Suzuki et al. | 29/740 |
| 5,517,748 | 5/1996 | Park | 29/741 |

FOREIGN PATENT DOCUMENTS

| | | | |
|---|---|---|---|
| 491448 | 6/1992 | European Pat. Off. | 29/742 |
| 64-34812 | 2/1989 | Japan . | |
| 3-106719 | 5/1991 | Japan . | |
| 4-354660 | 12/1992 | Japan | 29/33 P |
| 6-177591 | 6/1994 | Japan . | |
| 1829131 | 7/1993 | U.S.S.R. | 29/742 |

*Primary Examiner*—Peter Vo
*Attorney, Agent, or Firm*—Cushman, Darby & Cushman IP Group of Pillsbury Madison & Sutro LLP

[57] ABSTRACT

A first printed board transferred from a prior process on an inlet conveyer is placed on a moving unit at a first switching position. The moving unit moves to a second switching position while mounting the first printed board with electronic components from a component feeding section. During this process, a second printed board stands by at the second switching position via the inlet conveyer, a transit path and an intermediate conveyer. At the second switching position, the second printed board is placed on the moving unit while shunting out the first printed board onto an outlet conveyer for transfer to a subsequent process. The moving unit moves to the first switching position while mounting the second printed board with the electronic components from the component feeding section. At the first switching position, a third printed board standing by is placed on the moving unit while shunting out the second printed board onto the intermediate conveyer for transfer to the subsequent process via a transit path and the outlet conveyer. The foregoing processes are repeated to mount the electronic components onto the printed boards with high efficiency while the moving unit reciprocates between the first and second switching positions.

6 Claims, 4 Drawing Sheets

COMPONENT FEEDING SYSTEM

BACKGROUND OF THE INVENTION

1. Field of the Invention

The present invention relates to a component feeding system for mounting or attaching components onto a substrate or board, and more specifically, to a component feeding system for mounting electronic parts or components on a printed board.

2. Description of the Prior Art

FIGS. 3 and 4 show conventional component feeding systems, respectively, each for mounting electronic components on a printed board.

In the system shown in FIG. 3, a component feeding section 52 is fixedly installed around a turntable 51 in a fan-shaped fashion. A required component is picked out from the component feeding section 52 using corresponding one of suction nozzles 54 provided at the turntable 51 and then is mounted on a board held on an XY table 53. On the other hand, in the system shown in FIG. 4, a component feeding section 62 of a rectangular shape is provided so as to be movable in a reciprocating fashion. The component feeding section 62 is moved to a given take-out position so that a required component is taken out from the component feeding section 62 using one of suction nozzles 64 arranged at the turntable 61 and then mounted on a board held on an XY table 63.

On the other hand, Japanese First (unexamined) Patent Publication No. 6-177591 discloses a system for mounting electronic components on a printed board, which is arranged as follows: Electronic components are mounted on a printed board while the printed board is transferred, held on a transfer jig, on a transfer path. After completion of the mounting, the printed board is detached from the transfer jig. Then, the transfer jig is returned to a supply side of the printed boards via a return path which is arranged parallel to and under the foregoing transfer path.

However, the conventional component feeding systems shown in FIGS. 3 and 4 are both designed to be suitable for the production on a large scale with a small variety of components. Thus, if these conventional systems are used for the production on a small scale with a large variety of components, the following problems are encountered:

(1) In the system shown in FIG. 3, the number of component supply lanes at the component feeding section 52 is, in general, about 60. If the lane number increases, the turntable 51 is inevitably increased in size so that the high-speed operation thereof is made difficult. Further, the mechanical shock at the time of starting and stopping of the turntable 51 is enlarged. Moreover, since the turntable 51 is arranged at the center of the component feeding section 52, the maintenance of the suction nozzles 54 becomes further difficult. For the foregoing reasons, the lane number is limited. Thus, for the production on a small scale with a large variety of components, the kinds of components stored in the component supply lanes should be changed frequently.

(2) In the system shown in FIG. 4, an installation area corresponding to a moving range of the component feeding section 62 is required in addition to that corresponding to a size thereof. Accordingly, if the lane number is increased, a size of the system is also increased to require a large installation area thereof. Further, since a moving distance of the component feeding section 62 is also prolonged, the component mounting efficiency of the system is lowered. Moreover, since the required component is supplied to the suction nozzle 64 by moving the component feeding section 62, it is necessary to stop the component feeding section 62 for changing the kinds of components stored in the component supply lanes, or otherwise, it is necessary to provide a spare component feeding section 65 in addition to the component feeding section 62.

On the other hand, in the system disclosed in the foregoing Japanese Patent Publication, it is necessary to provide the return path for the empty transfer jig, that is, the transfer jig without the printed board, to be returned to the printed board supply side, in parallel to the transfer path for the transfer jig with the printed board. Thus, the system is increased in size. Further, the system requires a plurality of transfer jigs to be used for avoiding suspension of the mounting of the components onto the printed board while an empty transfer Jig is on the return path to return.

SUMMARY OF THE INVENTION

Therefore, it is an object of the present invention to provide an improved component feeding system.

According to one aspect of the present invention, a component feeding system comprises a first transfer lane for transferring a board; a component feeding section storing a plurality of components to be supplied to the board; a second transfer lane for transferring the board along the component feeding section; a moving unit movable on the second transfer lane for transferring the board to be mounted with the components from the component feeding section; and switching means for switching between the board on the first transfer lane before mounted with the components and the board on the moving unit after mounted with the components, the switching means provided at a first switching position and a second switching position, the first and second switching positions spacing a given distance from each other and connecting the first and second transfer lanes, wherein the moving unit moves on the second transfer lane in a reciprocating fashion between the first and second switching positions so that the switching means switches between the board on the first transfer lane and the board on the moving unit alternately at the first and second switching positions.

It may be arranged that the board to be switched for the board on the moving unit stands by alternately at the first and second switching positions.

It may be arranged that the switching means comprises a pushing claw provided at each of the first and second switching positions and that the pushing claw pushes the board on the first transfer lane in a forward direction along the first transfer lane so that the board on the first transfer lane is placed on the moving unit while shunting out the board on the moving unit onto the first transfer lane for transfer to a subsequent process.

It may be arranged that the moving unit mounts the components onto the boards while reciprocating on the second transfer lane.

It may be arranged that the moving unit mounts the same components onto the boards while reciprocating on the second transfer lane.

It may be arranged that the moving unit mounts the different components onto the boards while reciprocating on the second transfer lane.

BRIEF DESCRIPTION OF THE DRAWINGS

The present invention will be understood more fully from the detailed description given hereinbelow, taken in conjunction with the accompanying drawings.

In the drawings.

DESCRIPTION OF THE PREFERRED EMBODIMENT

Now, a preferred embodiment of the present invention will be described hereinbelow with reference to FIGS. 1, 2 and 5.

Figure 1:
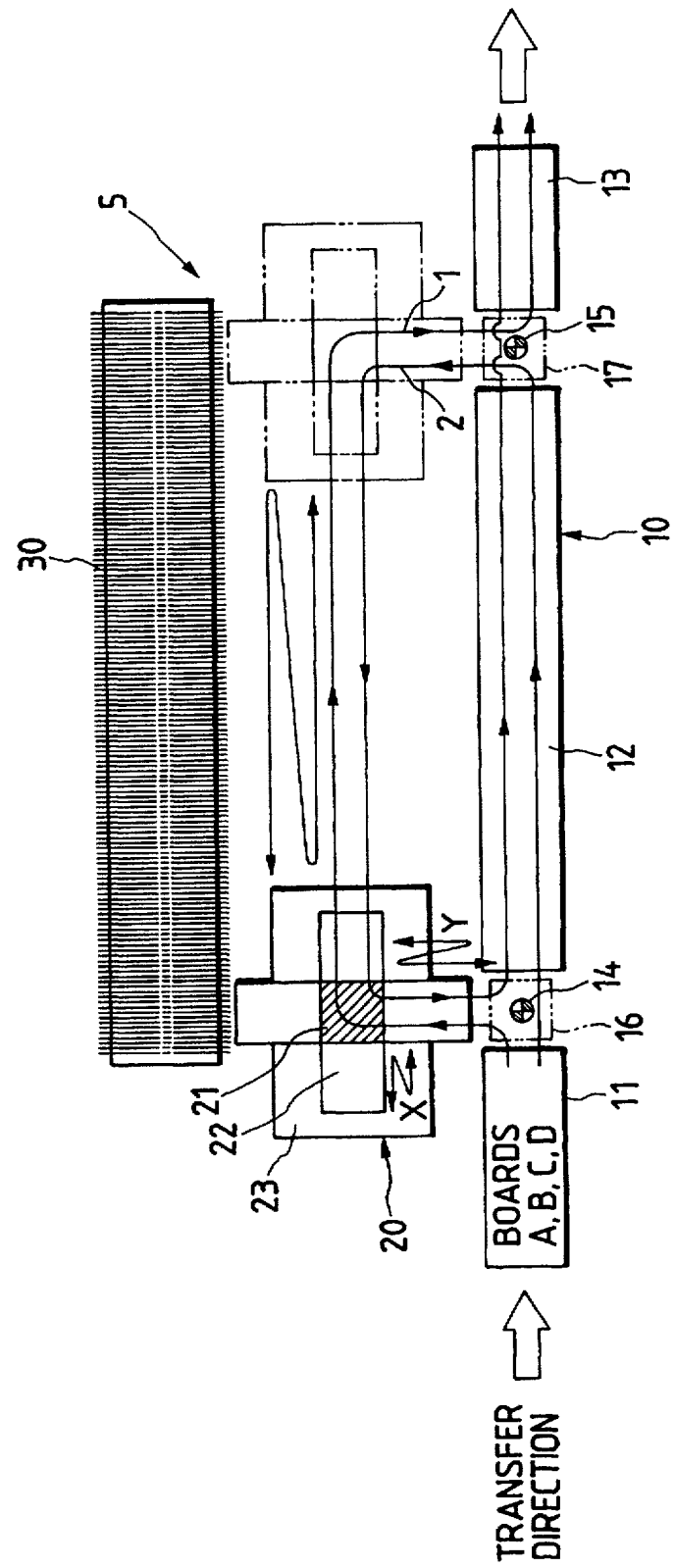
FIG. 1 is a diagram showing a schematic structure of a component feeding system according to a preferred embodiment of the present invention.
Figure 2:
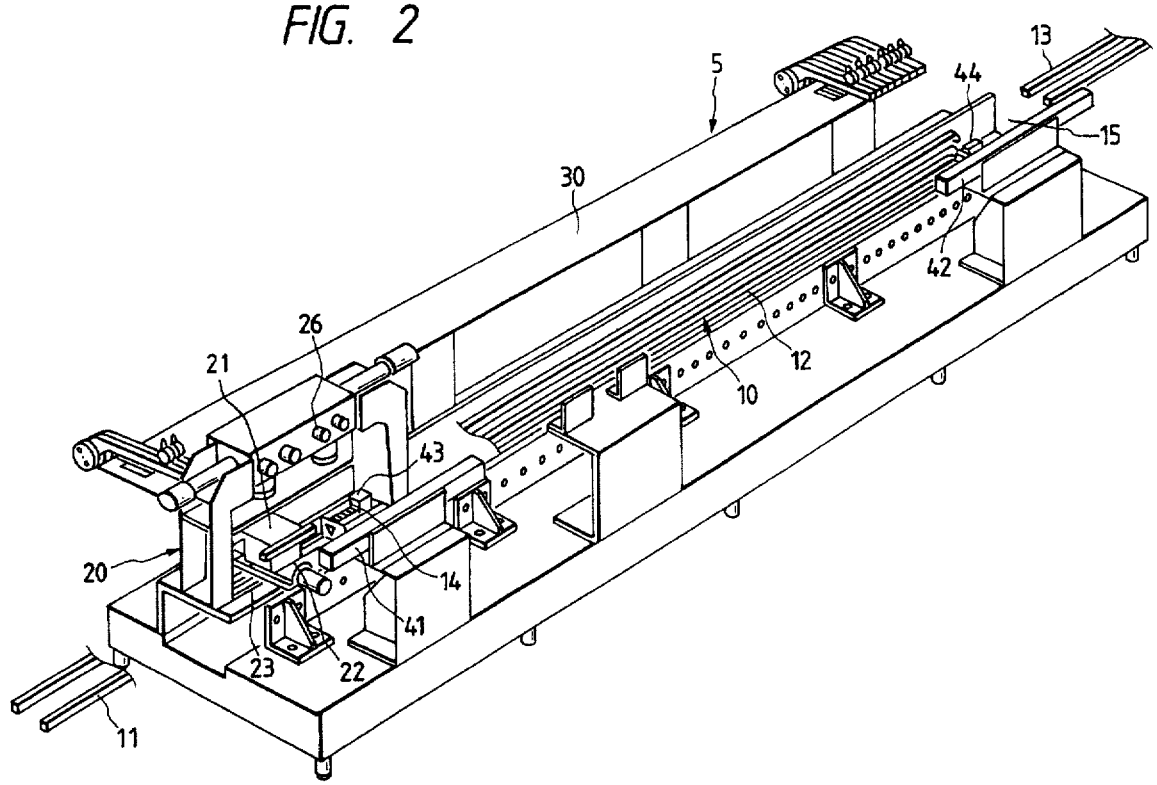
FIG. 2 is a perspective view showing the component feeding system according to the preferred embodiment of the present invention.
Figure 3:
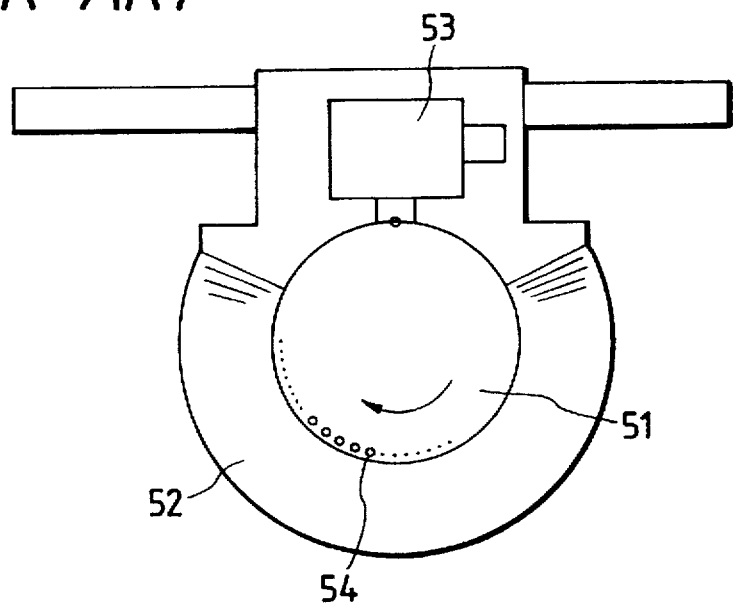
FIG. 3 is a diagram showing a schematic structure of a conventional component feeding system.
Figure 4:
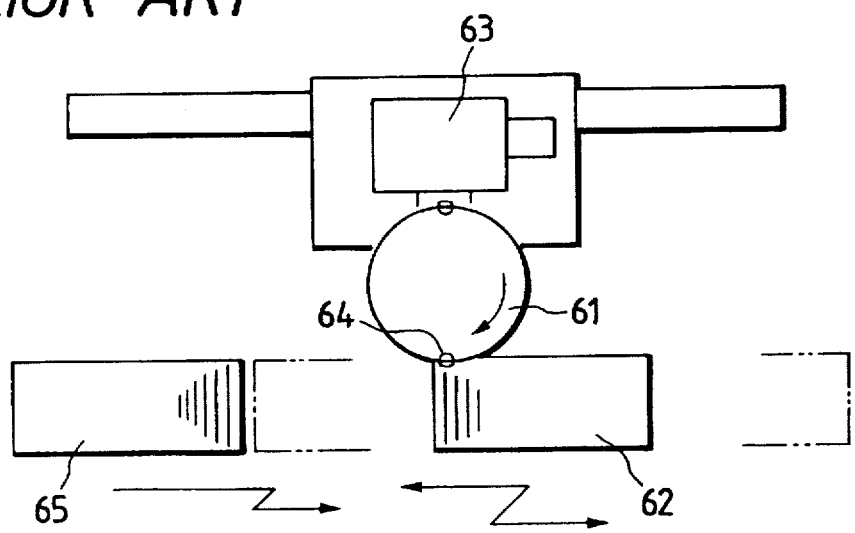
FIG. 4 is a diagram showing a schematic structure of another conventional component feeding system.

As shown in FIG. 1, an electronic component feeding system 5 includes a conveyer 10 for transferring a printed board, a moving unit 20 for mounting electronic components onto the printed board, and a component feeding section 30 for feeding the electronic components to be mounted onto the printed board.

The conveyer 10 as a first transfer lane includes an inlet conveyer 11, an intermediate conveyer 12 and an outlet conveyer 13 which are arranged in a linear fashion. The conveyers 11, 12 and 13 are driven independently of each other and transfer printed boards A, B, C, D, etc. from an inlet side toward an outlet side of the system 5, respectively. Between the inlet conveyer 11 and the intermediate conveyer 12 is arranged a first switching position 14, and between the intermediate conveyer 12 and the outlet conveyer 13 is arranged a second switching position 15. Under the first switching position 14 is provided a transit rail 16 which is ascendable to the first switching position 14, and under the second switching position 15 Is provided a transit rail 17 which is ascendable to the second switching position 15. As shown in FIG. 2, a switching unit 41 is provided in the neighborhood of the first switching position 14. The switching unit 41 includes a pushing claw 43 which is movable in a reciprocating fashion between an outlet side of the inlet conveyer 11 and an Inlet side of the intermediate conveyer 12. Similarly, a switching unit 42 is provided in the neighborhood of the second switching position 15. The switching unit 42 includes a pushing claw 44 which is movable in a reciprocating fashion between an outlet side of the intermediate conveyer 12 and an inlet side of the outlet conveyer 13.

The moving unit 20 includes a board fixing jig 21 for holding the printed board, an XY table 22 which can move the jig 21 in X and Y directions in FIG. 1, and a mounting unit moving device 23 carrying the jig 21, the XY table 22 and a mounting unit 26 (FIG. 2) and movable along a length of the component feeding section 30 in a reciprocating fashion. By means of the mounting unit moving device 23, the moving unit 20 can travel on a forward path, of a second transfer lane, extending from the first switching position 14 to the second switching position 15 along the length of the component feeding section 30, and on a backward path, of the second transfer lane, extending from the second switching position 15 to the first switching position 14 along the length of the component feeding section 30.

The component feeding section 30 is fixedly installed in a linear fashion along a length of the conveyer 10. In this preferred embodiment, the number of component supply lanes of the component feeding section 30 is set to 160. In each of the component supply lanes is provided a component cassette for sending out electronic components one by one.

Now, an operation of the electronic component feeding system 5 thus structured will be described hereinbelow.

(1) By means of the inlet conveyer 11, the first board A is transferred from the prior process (not shown) to the outlet side of the inlet conveyer 11. The jig 21 is moved on the XY table 22 so as to stand by at the first switching position 14. Then, the pushing claw 43 of the switching unit 41 pushes the board A toward the outlet side of the inlet conveyer 11 so that the board A is placed on the jig 21.

(2) Subsequently, the jig 21 carrying thereon the board A is moved on the XY table 22 toward the component feeding section 30. Then, the moving unit 20 is moved along the length of the component feeding section 30 from the inlet side to the outlet side of the system 5 while the mounting unit 26 picks out the given electronic components from the component supply lanes in given order for mounting them onto the board A. Since a structure of the mounting unit 26 itself is well known, no further explanation thereof will be given.

(3) While the electronic components are mounted onto the board A by the mounting unit 26, the transit raft 16 is raised up to the first switching position 14 to form a transfer path between the inlet conveyer 11 and the intermediate conveyer 12. By means of the inlet conveyer 11, the second board B is transferred from the prior process to the outlet side of the inlet conveyer 11. Then, the pushing claw 43 pushes the board B toward the outlet side of the inlet conveyer 11 so that the board B is transferred to the inlet side of the intermediate conveyer 12 passing on the transit rail 16 and then to the outlet side of the intermediate conveyer 12.

(4) While the moving unit 20 moves over the length of the component feeding section 30, the mounting of the electronic components onto the board A is finished. Then, the jig 21 carrying the board A is moved on the XY table 22 to the second switching position 15. At this moment, the board B stands by at the outlet side of the intermediate conveyer 12. The pushing claw 44 of the switching unit 42 pushes the board B toward the outlet side of the intermediate conveyer 12 so that the board B is placed on the jig 21. Simultaneously, the board A on the jig 21 is pushed or shunted out by the board B so as to be placed on the outlet conveyer 13 and then transferred to the next process (not shown) carried on the outlet conveyer 13.

(5) Subsequently, the jig 21 carrying thereon the board B is moved on the XY table 22 toward the component feeding section 30. Now, the moving unit 20 moves from the outlet side to the inlet side of the system 5 along the length of the component feeding section 30 while the mounting unit 26 picks out the given electronic components from the component supply lanes for mounting onto the board B in reverse order as compared with the board A. While the electronic components are mounted onto the board B by the mounting unit 16, the third board C is transferred from the prior process to the outlet side of the inlet conveyer 11.

(6) While the moving unit 20 moves over the length of the component feeding section 30, the mounting of the electronic components onto the board B is finished. Then, the jig 21 carrying thereon the board B is moved on the XY table 22 to the first switching position 14. By pushing the board C toward the outlet side of the inlet conveyer 11 using the pushing claw 43, the board C is placed on the jig 21 while shunting out the board B onto the intermediate conveyer 12. Subsequently, as in the foregoing process (2), the moving unit 20 moves along the length of the component feeding section 30 from the inlet side to the outlet side of the system 5 while mounting the electronic components onto the board C in given order.

(7) While the electronic components are mounted onto the board C, the transit rail 17 is raised up to the second switching position 15 to form a transfer path between the intermediate conveyer 12 and the outlet conveyer 13. The board B conveyed to the outlet side of the intermediate conveyer 12 is pushed by the pushing claw 44 toward the outlet side of the intermediate conveyer 12. Thus, the board B is carried onto the outlet conveyer 13 passing on the transit rail 17 and then transferred to the next process. Further, as in the foregoing process (3), the transit rail 16 is raised up to the first switching position 14 so that the fourth board D passes on the transit rail 16 and then is conveyed to the outlet side of the intermediate conveyer 12.

(8) After completion of the mounting of the electronic components onto the board C, the board D is placed on the jig 21 at the second switching position 15 by means of the switching unit 42, while the board C is shunted out onto the outlet conveyer 13 for transfer to the next process. After completion of the mounting of the electronic components onto the board D, the board D is transferred via the intermediate conveyer 12, the transit rail 17 and the outlet conveyer 13 toward the next process.

Figure 5:
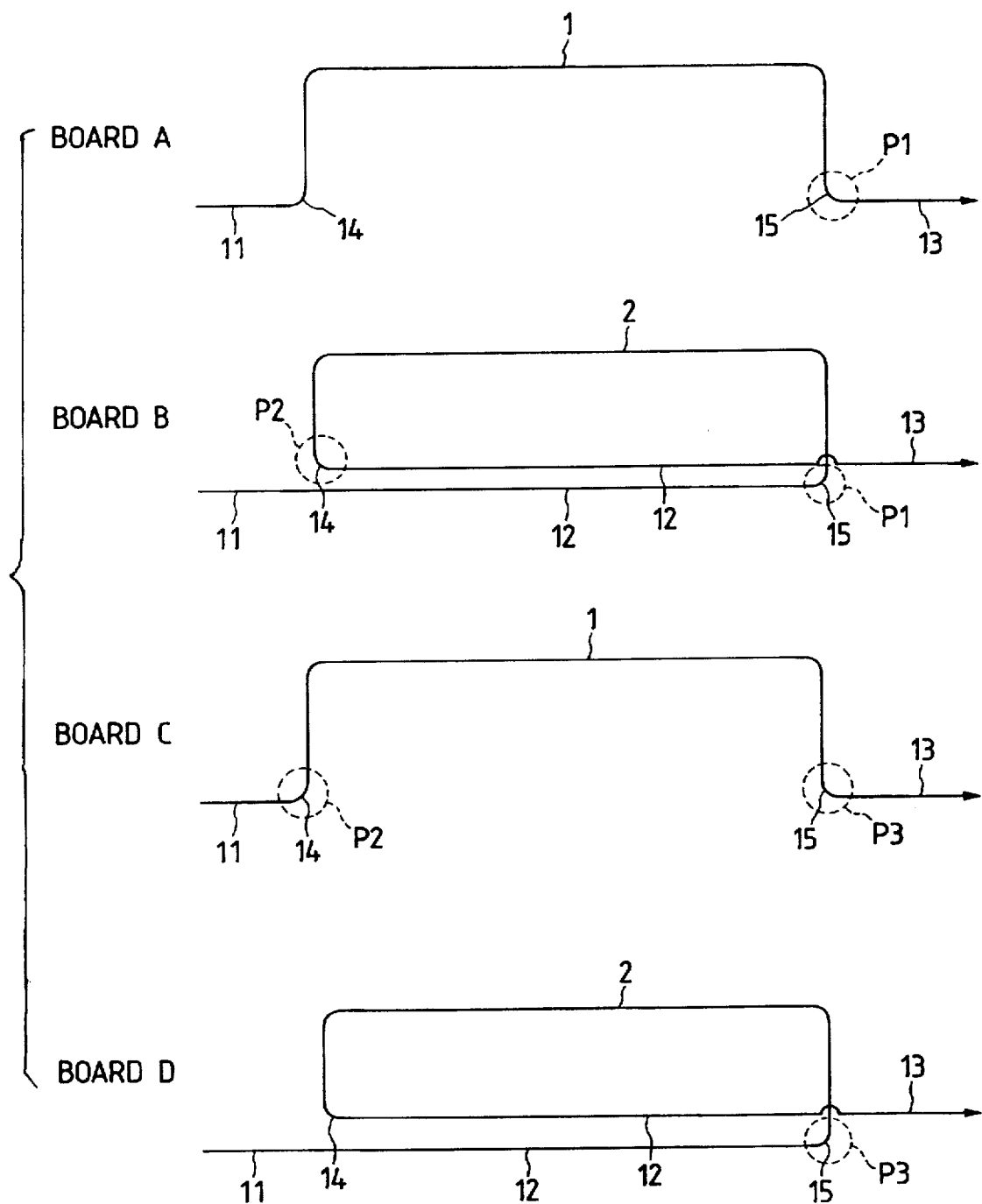
FIG. 5 is a diagram for explaining transfer paths of printed boards achieved in the component feeding system according to the preferred embodiment of the present invention.

FIG. 5 shows moving paths or transfer paths of the printed boards A, B, C and D through the foregoing processes (1) to (8).

The board A is placed from the inlet conveyer 11 as a part of the first transfer lane onto the moving unit 20 at the first switching position 14. Then, the moving unit 20 travels on a lane 1 being a forward path of the second transfer lane so that the board A is mounted with the electronic components from the component feeding section 30 and transferred to the second switching position 15. At the second switching position 15, the board B on the intermediate conveyer 12 as a part of the first transfer lane is switched for the board A on the moving unit 20. In the transfer paths of the boards A and B, the switching point between the boards A and B is shown at P1. Thus, the board B is placed on the moving unit 20 at P1. Then, the moving unit 20 travels on a lane 2 being a backward path of the second transfer lane so that the board B is mounted with the electronic components from the component feeding section 30 and transferred to the first switching position 14. At the first switching position 14, the board C on the inlet conveyer 11 is switched for the board B on the moving unit 20. In the transfer paths of the boards B and C, the switching point between the boards B and C is shown at P2. Similarly, the board C placed on the moving unit 20 at P2 is mounted with the electronic components from the component feeding section 30 and transferred to the second switching position 15. At the second switching position 15, the board C on the moving unit 20 is switched by the board D on the intermediate conveyer 12. In the transfer paths of the boards C and D, the switching point between the boards C and D is shown at P3.

Observing the movement of the moving unit 20, the moving unit 20 moves on the lane 1 (forward path) from the first switching position 14 to the second switching position 15 while mounting the electronic components onto the board A. The board A is switched by the board B at the second switching position 15. Then, the moving unit 20 moves on the lane 2 (backward path) from the second switching position 15 to the first switching position 14 while mounting the electronic components onto the board B. The board B is switched by the board C at the first switching position 14. By repeating these processes, the moving unit 20 mounts the electronic components onto the different printed boards on the forward path and the backward path while moving in a reciprocating fashion. As appreciated, although the lanes 1 and 2 (forward and backward paths) have been described as if they were different or separate lanes in view of facilitating explanation, the lanes 1 and 2 are actually the same one.

According to the electronic component feeding system 5 of this preferred embodiment, it is arranged that the boards on the first transfer lane and the moving unit 20 are switched therebetween at the first and second switching positions 14 and 15, respectively, using the switching units 41 and 42. This makes it possible to mount the electronic components onto the boards with high efficiency. Since the component feeding section 30 is fixedly installed in a linear fashion, a width of the component feeding section 30 can be minimized so that a size of the system 5 can be reduced even if the number of the component supply lanes is set to be large. Further, since the conveyer 10 as the first transfer lane and the lanes 1 and 2 forming the second transfer lane are arranged in parallel with each other, the size of the system 5 can be reduced also from this aspect. The moving unit 20 mounts the electronic components onto the different printed boards on the forward path and the backward path while reciprocating along the length of the component feeding section 30. This reduces a time period for which the moving unit 20 carries the board mounted with all the given electronic components or a time period for which the moving unit 20 carries no board. This makes the system 5 highly efficient. Since the boards are supplied to the moving unit 20 alternately at the first and second switching positions 14 and 15, the moving unit 20 is capable of mounting the electronic components onto the different boards on the forward and backward paths. By pushing the board on the first transfer lane using the pushing claw 43 or 44 of the switching unit 41 or 42, the board on the first transfer lane is placed on the moving unit 20 While shunting out the board on the moving unit 20 onto the first transfer lane. Accordingly, the structure of each of the switching units 41 and 42 can be rendered simple so that the system 5 can be reduced in size.

In the foregoing preferred embodiment, the number of the switching positions is two, while it may be three or more. Further, in the foregoing preferred embodiment, the same electronic components are mounted onto the different printed boards on the forward and backward paths. On the other hand, it may be arranged that different electronic components are mounted onto the different printed boards on the forward and backward paths.

While the present invention has been described in terms of the preferred embodiment, the invention is not to be limited thereto, but can be embodied in various ways without departing from the principle of the invention as defined in the appended claims.

What is claimed is:

1. A component feeding system for receiving component mountable boards, feeding components to said component mountable boards, and disposing component mounted boards comprising:

a first transfer lane for transferring said component mountable boards;

a component feeding section storing a plurality of components to be supplied to said component mountable boards;

a second transfer lane for transferring said component mountable boards along said component feeding section, said first transfer lane and said second transfer lane being operated independent from each other;

a moving unit movable on said second transfer lane for transferring one of said component mountable boards to be mounted with the components from said component feeding section; and switching means for switching between one of said component mountable boards on said first transfer lane before being mounted with said components and said component mounted board on said moving unit after being mounted with said components, said switching means being provided at a first switching position and a second switching position, said first and second switching positions being spaced a given distance from each other and said first switching position connecting said first and second transfer lanes, wherein said moving unit moves on said second transfer lane in a reciprocating fashion between said first and second switching positions so that said switching means switches between one of said component mountable boards on said first transfer lane and said component mounted board on said moving unit alternately at said first and second switching positions.

2. The component feeding system according to claim 1, wherein one of said component mountable boards to be switched for said component mounted board on said moving unit stands by alternately at said first and second switching positions.

3. The component feeding system according to claim 1, wherein said moving unit mounts the components onto one of said component mountable boards while reciprocating on said second transfer lane.

4. The component feeding system according to claim 3, wherein said moving unit mounts the same components onto another one of said component mountable boards while reciprocating on said second transfer lane.

5. The component feeding system according to claim 3, wherein said moving unit mounts the different components onto another one of said component mountable boards while reciprocating on said second transfer lane.

6. A component feeding system receiving for component mountable boards, feeding components to said component mountable boards, and disposing component mounted boards comprising:

a first transfer lane for transferring said component mountable boards;

a component feeding section storing a plurality of components to be supplied to said component mountable boards;

a second transfer lane for transferring said component mountable boards along said component feeding section;

a moving unit movable on said second transfer lane for transferring one of said component mountable boards to be mounted with the components from said component feeding section; and switching means for switching between one of said component mountable boards on said first transfer lane before being mounted with said components and said component mounted board on said moving unit after being mounted with said components, said switching means being provided at a first switching position and a second switching position, said first and second switching positions being spaced a given distance from each other and said first switching position connecting said first and second transfer lanes, wherein said moving unit moves on said second transfer lane in a reciprocating fashion between said first and second switching positions so that said switching means switches between one of said component mountable boards on said first transfer lane and said component mounted board on said moving unit alternately at said first and second switching positions, and wherein said switching means comprises a pushing claw provided at each of said first and second switching positions and wherein said pushing claw pushes one of said component mountable boards on said first transfer lane in a forward direction along said first transfer lane so that said component mountable board on said first transfer lane is placed on said moving unit while shunting out said component mounted boards on said moving unit onto said first transfer lane for transfer to a subsequent process.

* * * * *